United States Patent [19]

Enquist et al.

[11] Patent Number: 5,318,916

[45] Date of Patent: Jun. 7, 1994

[54] SYMMETRIC SELF-ALIGNED PROCESSING

[75] Inventors: Paul M. Enquist, Durham; David B. Slater, Jr., Raleigh, both of N.C.

[73] Assignee: Research Triangle Institute, Research Triangle Park, N.C.

[21] Appl. No.: 923,254

[22] Filed: Jul. 31, 1992

[51] Int. Cl.$^5$ .................................... H01L 21/265
[52] U.S. Cl. ................... 437/31; 437/126; 437/133; 437/909; 437/7; 148/DIG. 12; 148/DIG. 135
[58] Field of Search ............ 437/133, 31, 7, 126, 437/909, 915, 6; 148/DIG. 12, DIG. 135, DIG. 164

[56] References Cited

U.S. PATENT DOCUMENTS

| | | | |
|---|---|---|---|
| 3,997,367 | 12/1976 | Yau | 156/17 |
| 4,477,963 | 10/1984 | Cogan | 29/571 |
| 4,624,047 | 11/1986 | Tani | 29/576 |
| 4,683,487 | 7/1987 | Ueyanagi et al. | 357/34 |
| 4,706,378 | 11/1987 | Havemann | 437/24 |
| 4,728,606 | 3/1988 | Bukhman et al. | 437/33 |
| 4,794,093 | 12/1988 | Tong et al. | 437/203 |
| 4,824,805 | 4/1989 | Kajikawa | 437/228 |
| 4,870,028 | 9/1989 | Nishizawa et al. | 437/6 |
| 4,939,562 | 7/1990 | Adlerstein | 357/34 |
| 4,954,457 | 9/1990 | Jambotkar | 437/31 |
| 4,956,689 | 9/1990 | Yuan et al. | 357/34 |
| 4,965,218 | 10/1990 | Geissberger et al. | 437/41 |
| 4,965,650 | 10/1990 | Inada et al. | 357/34 |
| 4,967,252 | 10/1990 | Awano | 357/34 |
| 4,980,308 | 12/1990 | Hayashi et al. | 437/915 |
| 4,980,739 | 12/1990 | Favreau | 357/34 |
| 5,053,346 | 10/1991 | Yuan et al. | 437/22 |

Primary Examiner—Tom Thomas
Assistant Examiner—Tuan Nguyen
Attorney, Agent, or Firm—Oblon, Spivak, McClelland, Maier & Neustadt

[57] ABSTRACT

A method of manufacturing a semiconductor device using simplified processing and eliminating and/or minimizing the extrinsic parasitic elements of the device. The method is particularly suited for manufacturing heterojunction bipolar transistors where the extrinsic parasitic base resistance and the extrinsic parasitic base-collector and base-emitter capacitances can be virtually eliminated and the base contact resistance can be greatly reduced. The method includes formming symmetric emitter and collector portions using front and backside processing of the wafer, respectively. The symmetric emitter and collector virtually eliminates the extrinsic collector and emitter regions of the device thereby virtually eliminating the extrinsic base-collector and base-emitter capacitance. The extrinsic base contact region may also be increased to minimize the base contact resistance without increasing parasitic capacitive elements of the device. Self-aligned processing features are also included to form self-aligned contacts to the base layer thereby virtually eliminating the extrinsic base resistance. The method may include building up the collector and emitter contacts to separate the emitter and collector interconnections from the base layer to avoid increasing the emitter-base and collector-base extrinsic parasitic capacitances and to minimize associated resistances and inductances. The method may further include forming etch stop layers to facilitate removing of the substrate to perform the backside processing and to accurately etch through the collector layer without etching the base layer.

29 Claims, 8 Drawing Sheets

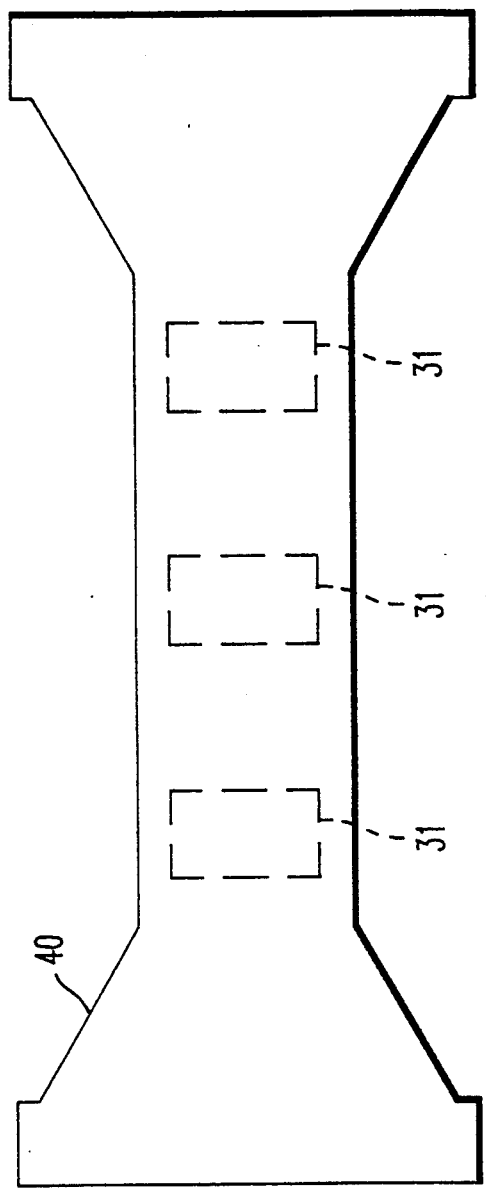

SYMMETRIC SELF-ALIGNED PROCESSING

BACKGROUND OF THE INVENTION

1. Field of the Invention

The present invention relates to a method for fabricating vertical semiconductor devices, and in particular to a method of manufacturing heterojunction bipolar transistors using simplified processing, virtually eliminating the extrinsic parasitic base resistance and extrinsic parasitic base-collector and emitter-base capacitances and significantly reducing the base contact resistance.

2. Discussion of the Background

In manufacturing three-terminal vertical devices, such as a heterojunction bipolar transistor (HBT), collector, base and emitter layers are successively deposited on a substrate. Functionally, the contact to the base region is from the side but in practice it is made from the top of the device. The contact to the collector region is functionally from the bottom of the device but in practice it is also made from the top of the device in a region outside the area of the base contact. This results in an overlap of the base and collector extrinsic to the intrinsic device which results in an extrinsic parasitic base-collector capacitance. Furthermore, the top of the extrinsic base typically consists primarily of a metallized portion which determines the base contact resistance to the extrinsic base and a much smaller unmetallized portion which determines the extrinsic base resistance to the intrinsic device. Decreasing the overlap results in a reduction in extrinsic parasitic capacitance but generally increases the base contact resistance since less area is available for the base contact metal. Thus, the base contact resistance and extrinsic capacitance cannot in practice be simultaneously minimized. This reduces the optimum device performance which can be realized and necessitates a compromise between base contact resistance and extrinsic base-collector capacitance in order to achieve optimum device performance.

Various approaches have been made to reduce and/or eliminate this compromise between parasitic capacitance and resistance. For example, U.S. Pat. No. 4,939,562 to Alderstein discloses a method of manufacturing HBTs where the HBT structure is "grown" in reverse (emitter-down) configuration. Although this approach virtually eliminates the extrinsic base-collector capacitance, it does so by replacing the base contact resistance/extrinsic base-collector capacitance compromise with a base contact resistance/extrinsic base-emitter capacitance compromise and as such does not address the fundamental problem of overlap between emitter, base and/or collector layers extrinsic to the device which arises from performing all processing on the top side of the substrate.

Other methods have attempted to alleviate the extrinsic base contact resistance/extrinsic base-collector capacitance compromise by employing self-aligned features in the processing methods. In U.S. Pat. No. 4,824,805 to Kajikawa and U.S. Pat. No. 4,965,650 to Inada et al, emitter mesas are formed with photoresist layers disposed thereon having a predetermined overlap of the emitter mesa to provide self-aligned base contacts on either side of and close to the emitter mesa. Although these self-aligned techniques allow a net reduction in extrinsic parasitics compared to non-self-aligned techniques, they do not avoid the base contact resistance/extrinsic base-collector capacitance compromise described above.

A method for fabricating a compound semiconductor bipolar device is disclosed in U.S. Pat. No. 4,967,252 to Awano which reduces the extrinsic base-collector capacitance (in an emitter-up configuration) or the emitter-base capacitance (in an emitter-down configuration). This reduction is achieved by a combination of removing part of the collector from underneath the base in the extrinsic part of the device and reducing that part of the base extrinsic to the device by contacting the base from the side of the device. Removing part of the collector from underneath the base reduces the parasitic extrinsic base-collector capacitance by lowering the dielectric constant underneath that part of the base where the collector is removed; however, this capacitance is not eliminated because part of the collector remains underneath that part of the base extrinsic to the device. Moreover, contacting the base from the side of the device increases the base contact resistance for practical values of base sheet resistance ($\rho_s$), contact resistivity ($\rho_c$) and width (w) as follows. For a top base contact, the base resistance is given approximately as $$\frac{\rho_s L_t}{2 l_e} \coth\left(\frac{S}{L_t}\right)$$

where $L_t$ is the transfer length given as $$\sqrt{\frac{\rho_c}{\rho_s}}$$

and $l_e$ is the emitter length and S is the width of the base metal. This expression takes into account the resistance associated with the transition of a lateral current flow in the base semiconductor to a vertical flow into the base metal. For a side base contact, the lateral current flow in the base semiconductor remains lateral as it flows into the base metal. The base contact resistance for a side contact is thus given as $$\frac{\rho_c}{l_e w}$$

For practical values of base sheet resistance ($<420$ ohms/square), contact resistivity ($>10^{-8}$ ohms-cm$^2$) and width ($<10^{-5}$ cm), and assuming the base metal width for the top base contact is at least twice the transfer length, the contact resistance from side base contacts exceeds that from top base contacts since the ratio of top to side base contacts is given approximately by $2L_t/w$. Thus, the advantages of eliminating the extrinsic capacitance according to Awano are generally offset by an increased contact resistance.

Furthermore, the process according to Awano is somewhat complicated and entails a number of critical etching processes requiring careful monitoring and control. The resulting structure is very complicated and all processing is performed on the front side of the substrate.

SUMMARY OF THE INVENTION

It is therefore an object of the present invention to provide a novel method of manufacturing vertical transistors, and in particular vertical HBTs that avoid the compromise between minimizing base contact resistance and minimizing extrinsic base-collector or base-emitter capacitance.

Another object of the present invention is to provide a method of manufacturing HBTs where the contact resistance to the base layer is greatly reduced.

An additional object of the present invention is to provide a method of manufacturing HBTs where the extrinsic parasitic base-collector and base-emitter capacitances are virtually eliminated.

A further object of the present invention is to allow for the device structure to be "grown" in the so-called "emitter-up" or "emitter-down" configuration as determined primarily by epitaxial growth considerations as opposed to reduction of parasitic extrinsic capacitance considerations.

A still further object of the invention is to provide a method of manufacturing HBTs having superior thermal conductivity by replacing the native substrate with a surrogate substrate having improved thermal conductivity.

Another object of the invention is to provide a method of manufacturing HBTs not limited by any constraints (i.e., electromagnetic absorption, structural rigidity, etc.) imposed by the native substrate by replacing this substrate with a surrogate substrate with improved properties.

A still further object of the present invention is to provide a method for manufacturing HBTs having symmetric collector and emitter contacts.

A further object of the present invention is to provide a method for manufacturing HBTs having reduced base recombination current by having base contacts electrically closer to the collector than the emitter.

A still further object of the present invention is to provide a method for manufacturing HBTs that provides for passivation above and/or below the exposed base region.

Still another object of the present invention is to provide a method of manufacturing HBTs utilizing self-aligned processing steps and utilizing simplified processing to produce the HBT.

These and other objects are obtained by a method of manufacturing a semiconductor device including successively forming first and second layers on a substrate, forming a third layer portion on the second layer, forming a first contact to the third layer portion, removing the substrate to expose the first layer, etching the first layer to form a first layer portion symmetric to the third layer portion, and forming second and third contacts to the first layer portion and the second layer, respectively. Having the first layer portion symmetric to the third layer portion virtually eliminates extrinsic capacitive parasitic elements of the device.

The method may further include attaching a surrogate substrate to the first contact prior to removing the substrate, the surrogate substrate providing structural rigidity for the device thus formed and, preferably, greater heat sinking capability or improvement in other properties compared to the native substrate.

The method may further include forming first and second etch stop layers between the first layer and the substrate and between the first layer and the second layer, respectively, removing the substrate using an etching process with a predetermined etch selectivity between the first etch stop layer and the substrate, removing the first etch stop layer to expose the first layer, and etching the first layer using an etching process having a predetermined etch selectivity between the second etch stop layer and the first layer, and removing the second etch stop layer to expose the second layer. The use of the etch stop layers provides for tighter device control since the layers of the device are typically thin and controlled etching is desirable. The second etch stop layer may also be formed to have a thickness which allows charge carriers to tunnel between the first and second layers.

The first embodiment of the method according to the invention may also include forming an etch stop layer between the first and second layers, removing the substrate using an etching process having a predetermined etch selectivity between the first layer and the substrate, etching the first layer using an etching process having a predetermined etch selectivity between the etch stop layer and the first layer, and then removing the etch stop layer to expose the second layer.

In the first embodiment, forming the third layer portion may be carried out by etching the third layer using a first contact portion formed on the third layer as a mask, or by forming a masking material on the second layer and then epitaxially growing the third layer portion in the aperture followed by removing the masking material.

The first embodiment preferably includes the steps of building up the first contact by repeatedly depositing a planarizing film, etching an aperture in the planarizing film to expose the first contact, and depositing a contact material in the aperture and on the contact. A first interconnection member is then formed on the built-up contact. This buildup of the first contact reduces the parasitic capacitance between the first interconnection member and the second layer by virtually eliminating any lateral overlap between the first interconnection member and the second layer while minimizing resistance and inductance associated with this interconnection member by conducting current vertically.

Similarly, the contact to the first layer may be built up and a second interconnection member attached thereto, which reduces the parasitic capacitance between the second interconnection member and the second layer and parasitic resistance and inductance associated with the interconnection member.

The first embodiment according to the invention can be used to form a heterojunction bipolar transistor, where a GaAs collector layer is formed as the first layer on a GaAs substrate, a GaAs base layer is formed as the second layer, and an AlGaAs/GaAs emitter layer is formed as the third layer. Further, one of a (Ga)AlAs layer and an AlAs layer may be used as a first etch stop layer and one of a (Ga)AlAs layer and an InGaAs layer may be used as the second etch stop layer.

In a second embodiment of the method according to the invention, a lower third contact self-aligned with the first contact is formed on a lower side of the second layer, and an upper third contact self-aligned with the second contact on an upper side of the second layer is formed, and an interconnection member is formed connected to at least one of the upper and lower third contacts.

In a third embodiment, upper and lower third contacts are formed as in the second embodiment, the third embodiment further including etching through the second layer to form an aperture therein and expose the lower third contact, and then forming the interconnection member to contact both the upper and lower third contacts.

The step of forming the third contact self-aligned with the first contact on a lower side of the second layer is included in a fourth embodiment of the invention. The fourth embodiment further includes etching through the second layer to expose the third contact, and then forming the interconnection member to contact the third contact.

In a fifth embodiment, a thin layer of material (wider bandgap emitter, etch stop, etc.) offering a passivating or alternate benefit is retained on the top and/or bottom of the second layer before application of upper and/or lower third contacts, respectively.

The above objects can also be achieved by a method of manufacturing a vertical semiconductor device including the steps of successively forming a plurality of semiconductor layers on a substrate, processing an uppermost layer of the plurality of layers to form a desired configuration thereof and a first contact thereto using a topside of the plurality of semiconductor layers, and processing the layer other than the uppermost layer to form a desired configuration thereof symmetric to the first configuration and a second contact thereto using a backside of the plurality of semiconductor layers.

The above objects may be further achieved using a method of manufacturing a heterojunction bipolar transistor including forming collector, base and emitter layers on a substrate, and forming a first etch stop layer between the substrate and the collector layer and a second etch stop layer between the collector and base layers. The method also includes forming a collector symmetric to the emitter and forming self-aligned base contacts using at least one of the emitter and collector contacts as a mask.

It is also an object of the present invention to provide a semiconductor device with virtually no extrinsic parasitic base resistance, base-collector and base-emitter capacitance, and greatly reduced base contact resistance. This object is achieved by a semiconductor device having a surrogate substrate, a first portion of semiconductor material, a first interconnection electrically connected to the first portion and disposed between the first portion and the surrogate substrate, the first interconnection including first contacts separating the first portion from the surrogate substrate by a first desired distance, a first layer of semiconductor material disposed on the first portion of semiconductor material, and a second portion of semiconductor material disposed on the first layer of semiconductor material and arranged symmetric with the first portion. A second interconnection electrically connected to the first layer of the semiconductor material and having contacts self-aligned with the first and/or second portion, and a third interconnection electrically connected to the second portion of semiconductor material and having third contacts separating the third interconnection from the first layer by second predetermined distance are also included in the device according to the invention.

DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 4A and 4B are a sectional view and a plan view, respectively, of an HBT illustrating the formation of the emitter electrode;

DESCRIPTION OF THE PREFERRED EMBODIMENTS

Figure 1A:
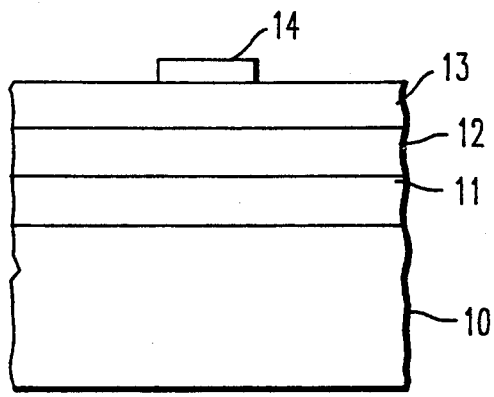
FIGS. 1A and 1B are sectional views of an HBT illustrating a first embodiment of the method according to the invention.

Referring now to the drawings, wherein like reference numerals designate identical or corresponding parts throughout the several views, and more particularly to FIG. 1A thereof, there is shown a sectional view illustrating a first embodiment of the method according to the invention. It should be pointed out that the drawings are schematic representations of the invention and are not meant to show actual or relative device dimensions, thicknesses, etc. The drawings are only meant to illustrate the invention to allow one of ordinary skill in the art to understand how to make and use the same. For example, the drawings typically show a single transistor, but it is understood that a typical device may contain a number of transistors connected together, as indicated from the top views of the illustrated embodiments.

FIG. 1A shows emitter layer 13, base layer 12 and collector layer 11 formed on top of a substrate 10 with a metal contact 14 formed on the surface of the emitter layer 13. Typically, substrate 10 is a GaAs material, collector layer 11 is a GaAs layer of approximately 5,000 Å in thickness, base layer 12 is an 800 Å thick GaAs layer and emitter layer 13 is a composite 200 Å thick AlGaAs, 500 Å thick AlGaAs-GaAs grade and 2000 Å thick GaAs layer, although other thicknesses and materials are possible.

Figure 1B:
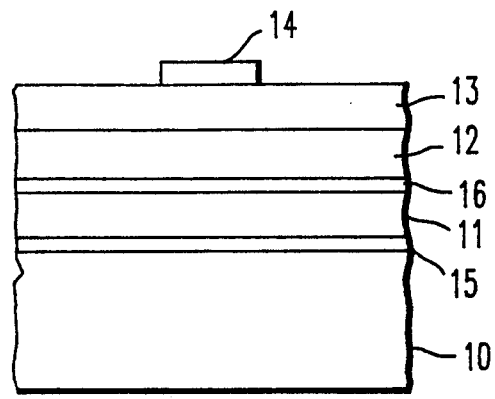

FIG. 1B illustrates the emitter, base and collector layers with a collector etch stop layer 15 disposed between collector 11 and substrate 10, and a base etch stop layer 16 disposed between base layer 12 and emitter layer 13. Etch stop layers 15 and 16 are described in greater detail below.

Figure 2:
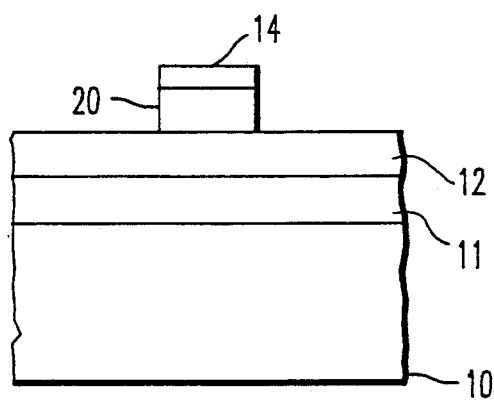
FIG. 2 is a sectional view of an HBT illustrating an emitter mesa forming step of the method according to the invention.

Referring now to FIG. 2, emitter layer 13 is etched using the emitter contact 14 as a mask to etch down to base layer 12. This etching may be carried out using a combination of known wet and/or dry selective and/or nonselective etches.

An alternative method of forming emitter mesa 20 is through selective regrowth where a masking material is deposited over a base layer, an aperture is etched therein and emitter is regrown in the aperture. Such a process is described in copending application Ser. No. 07/853,439 by the inventors of this application which is herein incorporated by reference.

Figure 3:
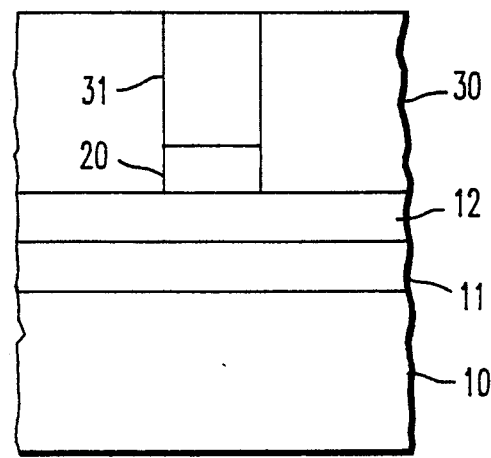
FIG. 3 is a sectional view showing the step of building up the emitter metal contact.

In the first embodiment, a planarizing dielectric material 30 is deposited over the base layer followed by a metal deposition. A polyimide or probimide may be used for the planarizing dielectric film 30. This step is repeatedly carried out to increase the thickness of the emitter contact 14 to provide thick emitter contact 31, as shown in FIG. 3. The building up of the contact may also be carried out in a single step by depositing a thicker planarizing dielectric material and then depositing a thicker metal layer over emitter contact 14. The thickness of the thick emitter contact 31 is typically 1 μm to a few μm, depending upon desired device characteristics.

The subsequent steps of building-up the emitter contact may be carried out by re-exposing the mask used to form emitter contact 14 and then evaporating or depositing the metal layer. The steps are repeated until a sufficient distance is achieved between the top of the base layer 12 and thick emitter contact 31 to reduce the emitter-base capacitance between base layer 12 and subsequent emitter electrode 40 formation to an insignificant level which will not affect device performance. Reuse of the emitter contact mask reduces the number of photolithographic mask plates required by the method according to the invention reducing processing complexity.

Figure 4A:
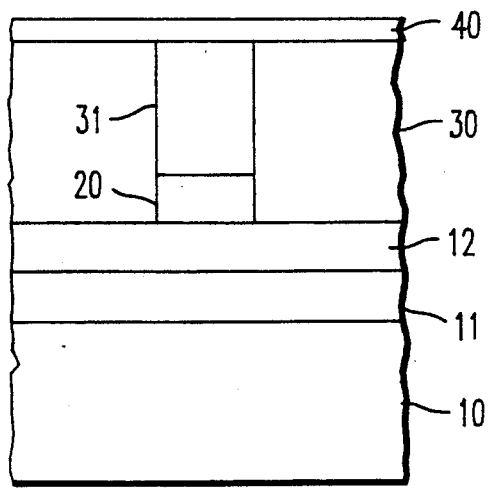
Figure 5:
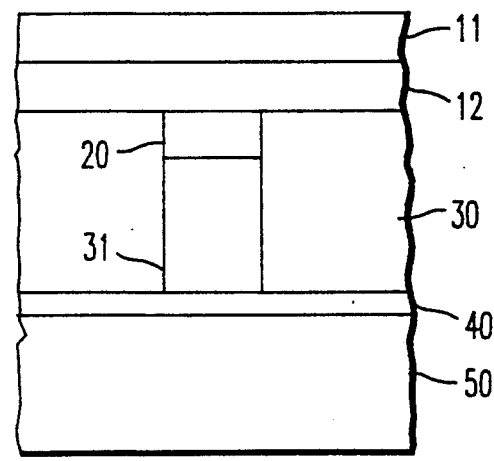
FIG. 5 is a sectional view of an HBT illustrating the attachment of a surrogate substrate and removal of the substrate from the back side.

The emitter backplane metallization is carried out forming emitter electrode 40 as shown in FIGS. 4A and 4B. Typical photolithographic and metal deposition techniques may be used for the emitter backplane metallization. A surrogate substrate 50 is then attached to the emitter backplane metallization using any one or a combination of standard procedures including but not limited to van der-Walls bonding, metal-metal bonding, silver paste or conductive epoxy (FIG. 5). Surrogate substrate 50 preferably has good thermal conductivity to act as a heat sink. Surrogate substrate 50 could be made of diamond, SiC, BeO, etc, and thus can provide both improved thermal conductivity and structural rigidity for the remainder of the processing and the final device structure. Surrogate substrate 50 may offer additional benefits compared to the native substrate.

Also illustrated in FIG. 5 is the backside processing where substrate 10 is removed to expose collector layer 11. This backside processing may be carried out by first lapping or polishing the wafer and then chemically etching the wafer to complete substrate removal. Typically, the wafer is lapped or polished to a thickness of about 0.004 inches.

While not explicitly shown in FIG. 5, etch stop layer 15 comprising a thin layer of semiconductor material approximately 200 Å thick, depending upon the etching selectivity, may be disposed between the collector and the substrate. The purpose of etch stop layer 15 is to facilitate the backside processing to avoid excessive etching of collector layer 11. For example, in the AlGaAs/GaAs structure, etch stop layer 15 can be AlAs or an alloy of In or Al with GaAs having sufficient In or Al composition, respectively. Note that this etch stop does not compromise the internal device structure since it is exterior to the internal device structure. Furthermore, note that the use of an In alloy is not lattice-matched. However, this is not a major concern since etch stop layer 15 is very thin and the lattice mismatched layer can be pseudomorphic (i.e., does not generate undesired dislocations).

Wet or dry etching can also be used to alteratively remove the GaAs substrate. For example, the majority of the substrate could be first removed with lapping or polishing with a bromine/methanol polishing solution is to thin the substrate to a thickness of about 100 microns. A hydrogen peroxide/ammonium hydroxide solution could then be used to etch the remaining GaAs without etching through etch stop layer 15. The latter etch to the etch stop may be replaced with a freon-based or boron trichloride dry etch if the etch stop contains sufficient Al or In composition, respectively, to provide etch selectivity. Etch stop layer 15 can then be selectively removed with a hydrofluoric solution if (Ga)AlAs with sufficient Al composition is used.

Figure 6:
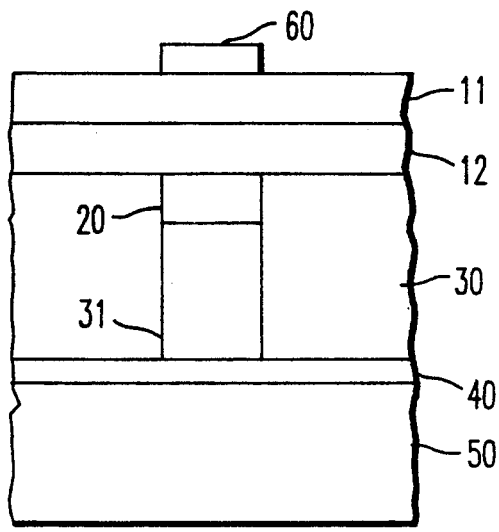
FIG. 6 is a sectional view of an HBT illustrating a collector contact formation step.

A collector metal contact 60 is then deposited on collector layer 11 symmetrically aligned with the thick emitter metal contact 31. Symmetric alignment of collector metal contact 60 to thick emitter metal contact 31 may be defined as of nominally the same size and shape and vertically aligned. The metallization may be carried out using standard processing techniques. The alignment of collector contact 60 with emitter contact 31 may be carried out using an infrared alignment tool. Since the collector and base layers are thin, the collector contact 60 can be accurately aligned with emitter contact 31 using the infrared alignment tool. Furthermore, for very thin collector and base layers, the alignment may be done with a conventional visible alignment tool since the emitter contact 31 will be visible from the collector backside and thus serve as an alignment mark. Note that this is the only critical alignment in the process according to the first embodiment of the invention and only the third masking level. The structure after forming collector contact 60 is shown in FIG. 6.

Figure 7:
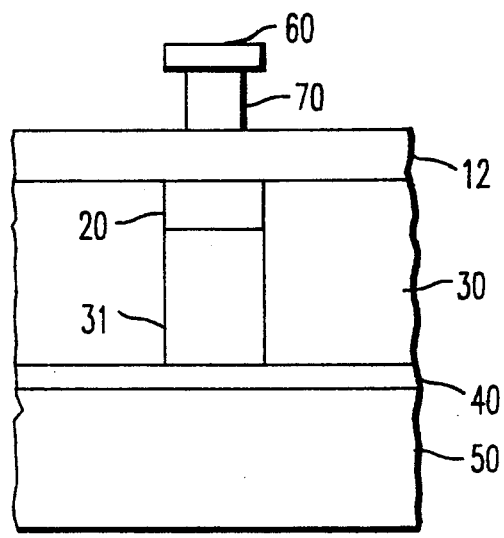
FIG. 7 is a sectional view of an HBT illustrating a collector mesa formation step.

Collector layer 11 is then etched in a manner similar to the etching of emitter layer 13 to produce the collector mesa 70, as shown in FIG. 7. Base etch stop layer 16 is preferably used between the base and collector layers and is subsequently removed. Base etch stop layer 16 is typically a 100 Å thick layer of (Ga)AlAs or InGaAs. Base etch stop layer 16 can be thinner than etch stop layer 15 since a thickness of the collector etched from the collector etch stop layer 15 to the base etch stop layer 16 is much less than the thickness of substrate 10 removed to expose collector etch stop layer 15.

Collector layer 11 can also be etched using the above-mentioned hydrogen peroxide/ammonium hydroxide solution if collector layer 11 is GaAs and base etch stop layer 16 is (Ga)AlAs of sufficient Al composition. When a GaAs collector is used, it could alternatively be removed with a freon-based dry etch which selectively etches GaAs compared to AlGaAs. The dry etch has the advantage of providing undercut with an overetch to facilitate subsequent self-aligned base metallization in addition to requiring a minimum amount of aluminum alloy (approximately 5%) in order to be selective. Dry etches other than a freon-base etch could also be employed. Using InGaAs as the base etch stop layer 16 would also require a minimum amount of In alloy (approximately 5%). However, a boron trichloride dry etch would then be preferably used instead of the freon-based etch.

Figure 8A:
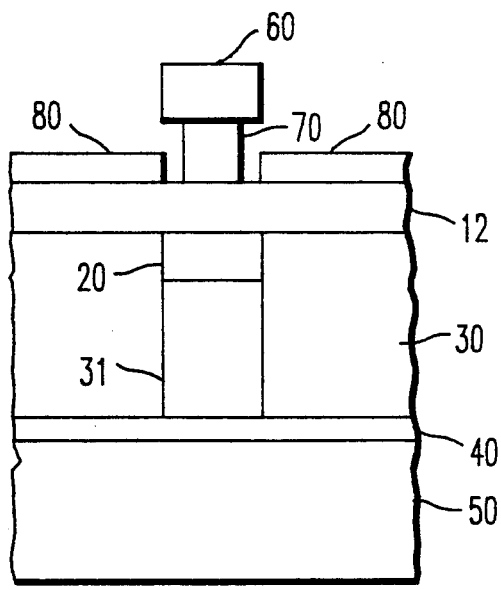
FIGS. 8A and 8B are a sectional view and a plan view of an HBT illustrating a base contact formation step.
Figure 8B:
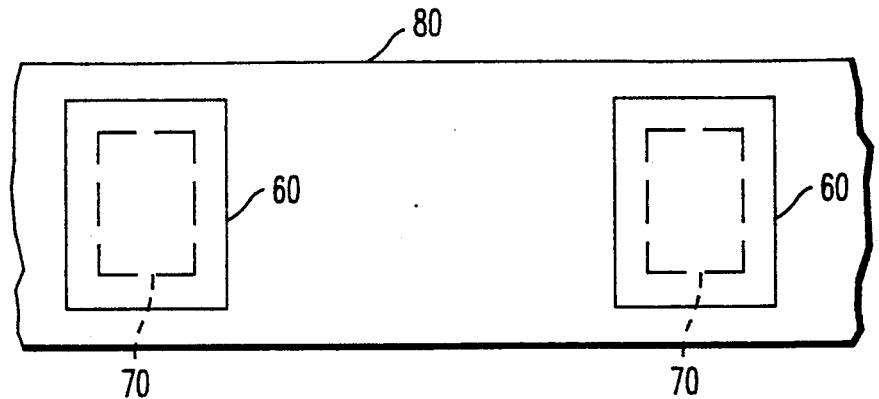

The base metallization is then performed using standard photolithographic and depositing techniques to provide base contacts 80, as shown in FIG. 8A. Base contacts 80 are self-aligned to the collector mesa 70 using collector metal contact 60 as a mask. Contact 60 is increased in thickness due to the metal deposited thereon when forming contacts 80. The undercutting of collector mesa 70 with respect to collector contact 60 provides separation between base contact 80 and collector mesa 70. The undercutting of the collector mesa 70 provides a self-aligned base contact. The undercutting should be large enough to avoid shorting between base contact 80 and collector contact 60 and to avoid excessive recombination, but should be kept to a minimum to reduce parasitic base resistance. This undercutting, for example, may be a result of wet etching to the etch stop layer due to comparable lateral and vertical etch rates or of dry etching for longer than required to reach the etch stop due to cessation of the vertical etch rate without cessation of the lateral etch rate. FIG. 8B shows the metal base contacts 80 are formed to surround the collector mesa 70.

Figure 8C:
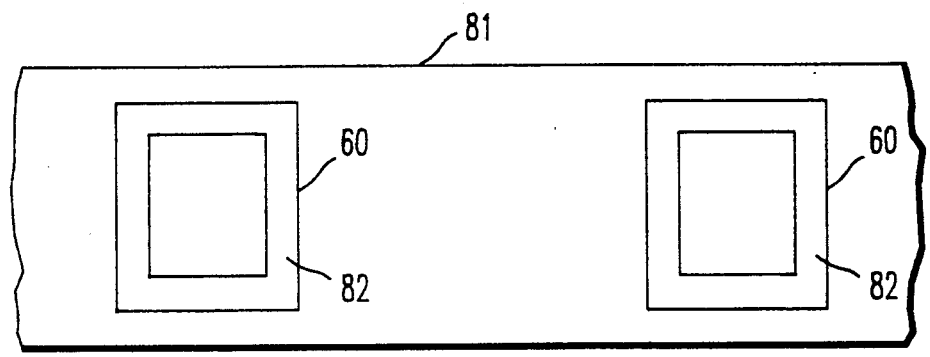
FIGS. 8C and 8D are a plan view and a sectional view of an HBT illustrating a modification of the base contact formation step shown in FIGS. 8A and 8B.
Figure 8D:
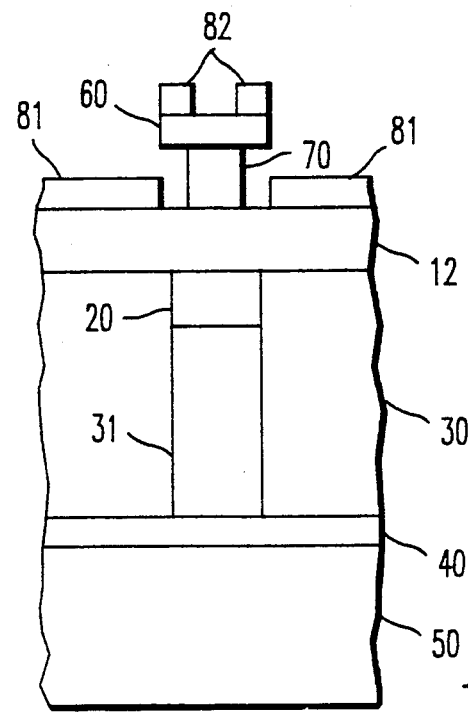

An alternate configuration of metal base contact is given in FIG. 8C and the corresponding cross section is given in FIG. 8D. Base metal is deposited to form base contacts 81 surrounding the collector mesa 70 as in the first embodiment, but the base metal covers only a portion of the periphery of collector contact 60 to form portion 82. This allows subsequent thick collector contact 90 to be in direct contact with collector metal contact 60 providing for decreased resistance for some types of base metals without requiring a critical alignment.

Figure 8E:
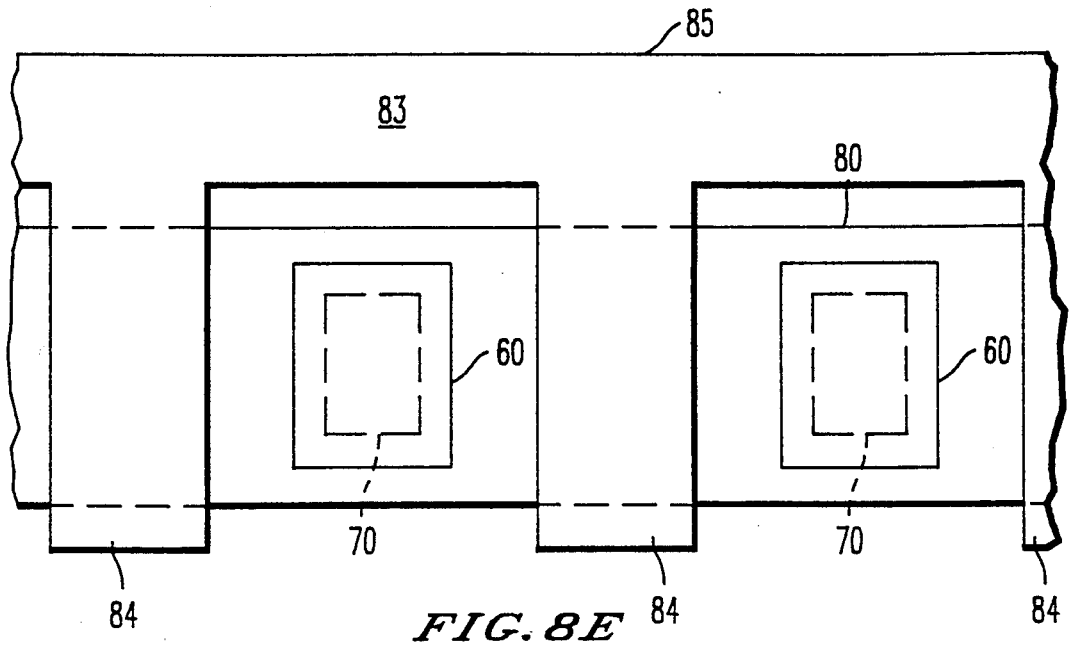
FIG. 8E is a plan view illustrating a base electrode forming step of the method according to the invention.

Next, a base electrode 83 is deposited to interconnect the several base contacts 80. FIG. 8E shows base electrode 83 which consists of a number of fingers 84 connected together by a transverse portion 85. In the finished device, the contact to the base metallization is made from the side of the device.

Figure 9A:
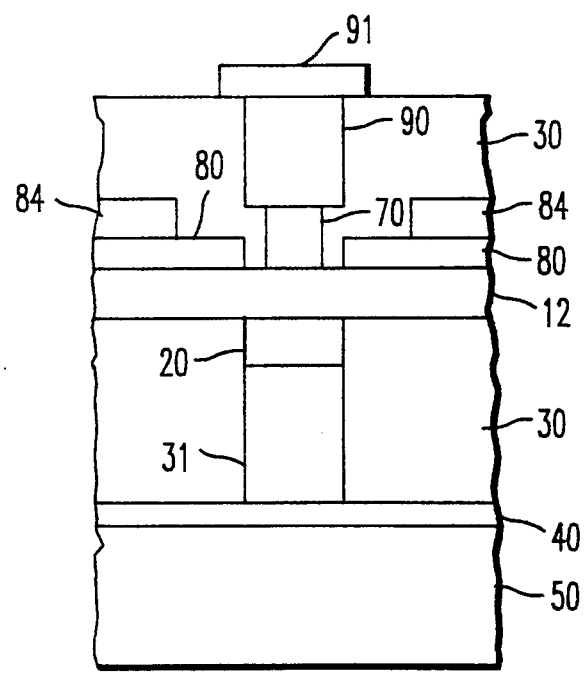
FIGS. 9A and 9B are a sectional view and a plan view, respectively, of an HBT illustrating the steps of building up the collector contact and forming the collector electrode.

The collector contact is then increased in thickness in a manner similar to that used to form thick emitter contact 31 to provide thick collector contact 90. The collector electrode 91 is deposited over the dielectric material 30 and thick collector contact 90, which is shown in FIG. 9A. The formation of collector electrode 91 can be carried out using standard metallization and photolithography techniques. The thickness of the collector contact is increased to reduce parasitic capacitance between collector electrode 91 and base contacts 80 or 81 by increasing the distance between these two parts. The resistance and inductance associated with collector contact 90 is minimized by conducting current vertically.

Figure 9B:
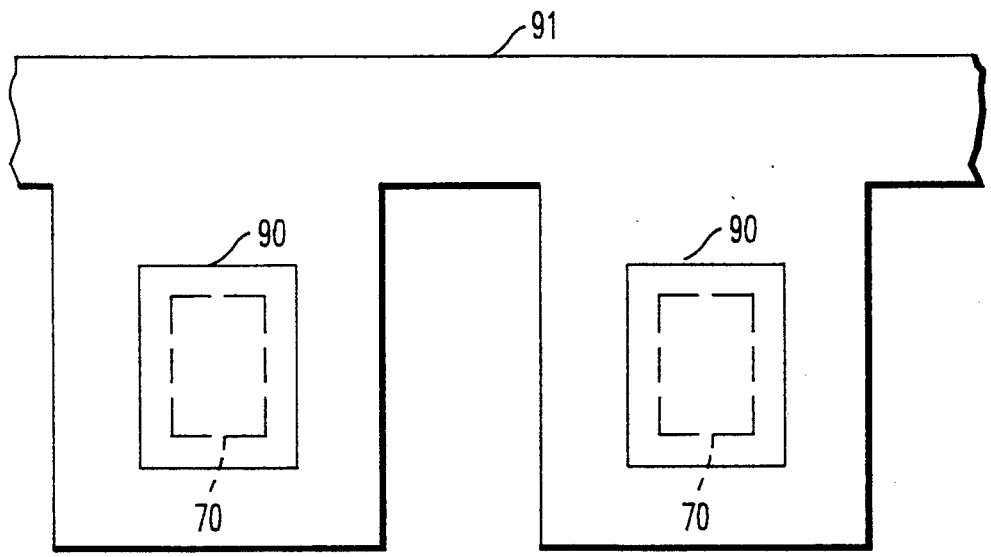

The pattern of collector electrode 91 on top of the device is shown in FIG. 9B. The interdigitated configuration virtually eliminates the lateral overlap between the base contacts and collector electrode which reduces the parasitic base-collector capacitance. Alternatively, if the built-up collector contact is sufficiently thick, then the parasitic base-collector capacitance due to the interconnects is virtually negligible and the collector electrode can be of rectangular shape without interdigitation.

The device is completed by making appropriate contacts to the emitter, base and collector interconnects, which is apparent to one of ordinary skill in the art. The method according to the first embodiment of the invention virtually eliminates the extrinsic parasitic base-collector and base-emitter capacitance and the extrinsic parasitic base resistance and greatly reduces the base contact resistance while simplifying fabrication through the exploitation of self-alignment features and only one critical alignment.

As mentioned above, a device may consist of a number of individual transistors connected together. The individual devices have emitters or collectors which are of a size on the order of 1 $\mu$m by 10 $\mu$m separated by 1 $\mu$m to 10 $\mu$m, depending upon the desired device characteristics.

Having the emitter and collector portions symmetric virtually eliminates extrinsic parasitic capacitive elements of the device. It also allows the extrinsic base contact region to be wide enough to minimize the base contact resistance without incurring an increase in extrinsic capacitive parasitic elements of the device. It further allows alloyed base contacts to be used with relatively little concern with alloying beyond the thin base layer which might otherwise compromise junctions or epitaxial material below the base.

Figure 10:
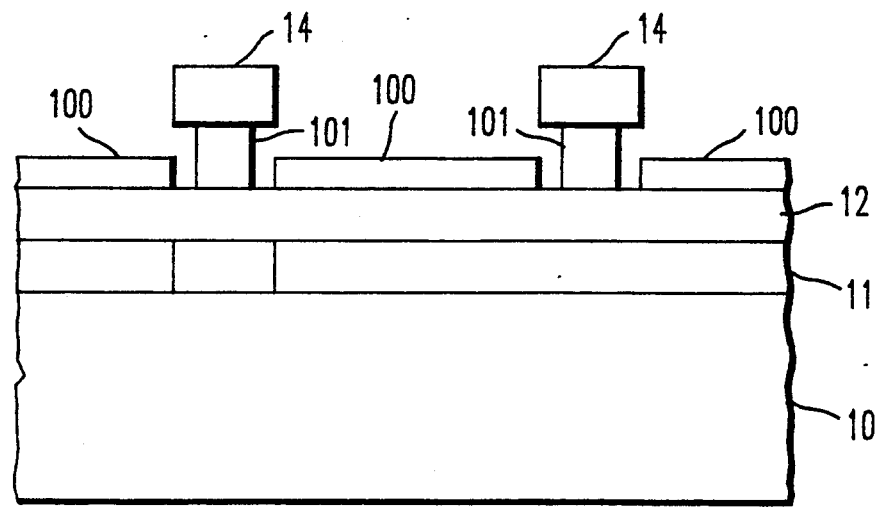
FIG. 10 is a sectional view of an HBT illustrating a second embodiment of the method according to the invention.
Figure 11:
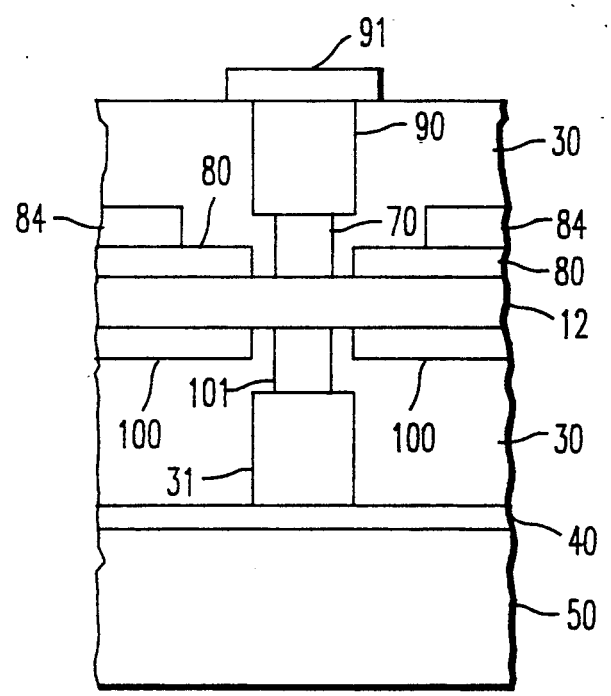
FIG. 11 is a sectional view of an HBT illustrating the device obtained using the second embodiment of the method according to the invention.

A second embodiment of the method according to the invention will be described in connection with FIG. 10. The processing in the second embodiment includes the same steps as in the first embodiment illustrated in FIGS. 1 and 2. In this embodiment, the emitter contact is undercut in the same manner as in the formation of collector mesa 70, to form emitter mesa 101. After formation of emitter mesa 101, metal is deposited using the emitter contact 14 as a mask to provide second base contacts 100. The amount of undercut is sufficient to avoid shorting between emitter contact 14 and subsequent second base contacts 100 and to avoid excessive recombination while being kept to a minimum to minimize extrinsic resistance. This step provides a self-aligned base contact to the emitter mesa and is carried out in the same manner as in forming the base contacts 80 or 81, respectively. However, no base interconnection is formed and the first base contacts are not directly contacted. The processing is continued using the same steps as illustrated in FIGS. 3–9 of the first embodiment. The resulting device in the second embodiment is identical to the first embodiment except that a base contact is provided on both sides of the thin base layer (FIG. 11). For certain values of base width, sheet resistance and contact resistivity, the resistance between base contacts 80 or 81 and 100 is very low and these two contacts are essentially shorted together. This reduces the base contact resistance by approximately a factor of two thereby reducing one more parasitic element of the device.

Figure 12B:
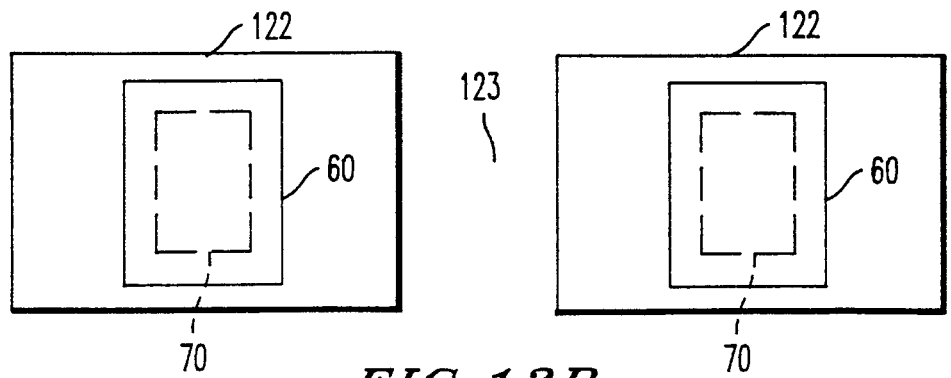
FIGS. 12A and 12B are a sectional view and a plan view, respectively, of an HBT illustrating a third embodiment of the method according to the invention.
Figure 12A:
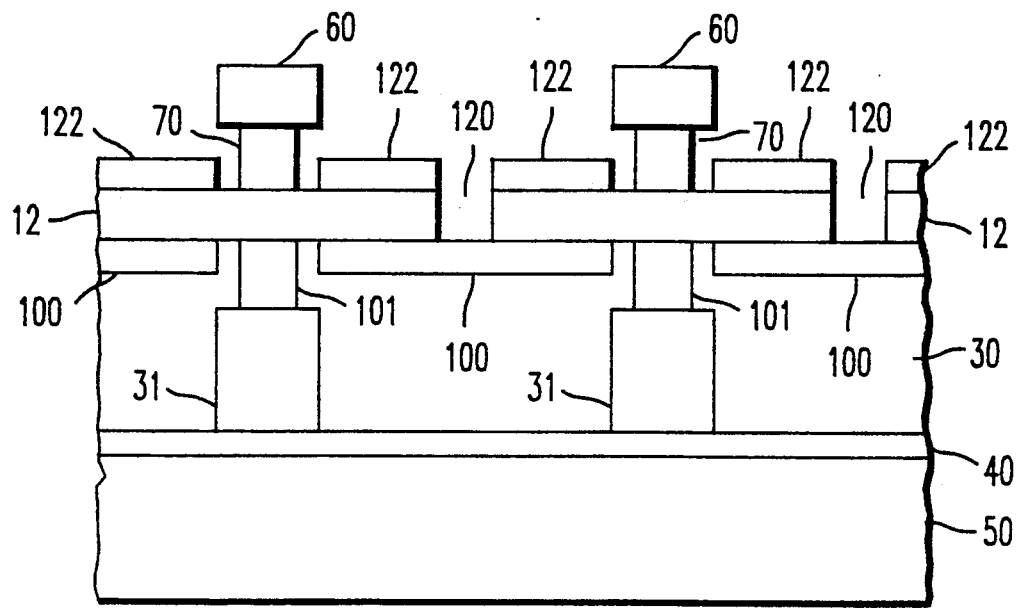
Figure 13:
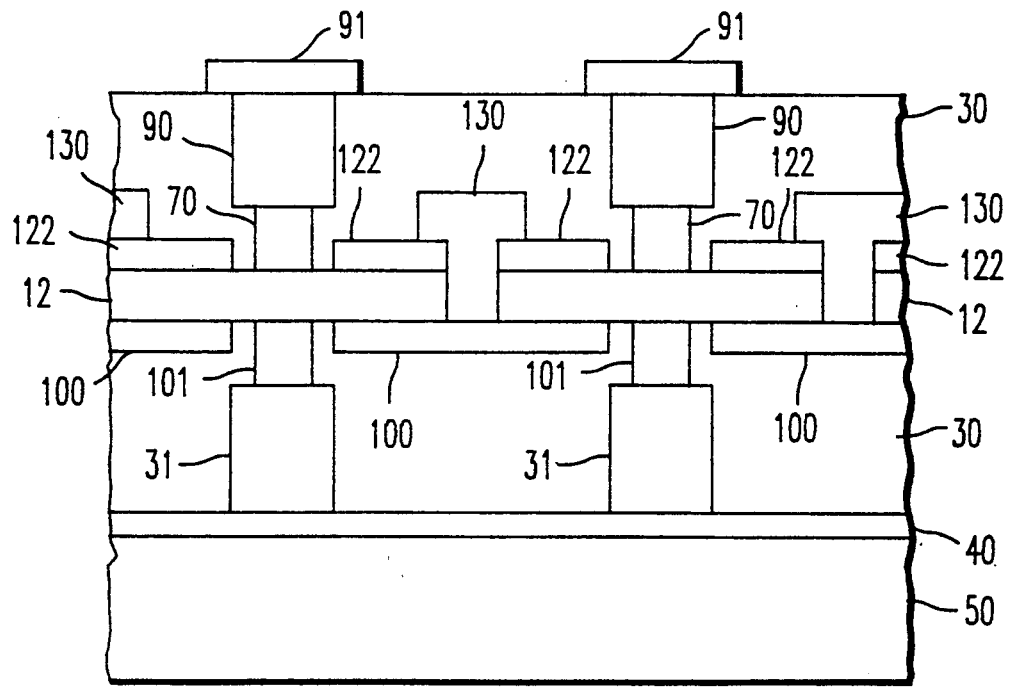
FIG. 13 is a sectional view of an HBT illustrating the device obtained using the third embodiment of the method according to the invention.

In a third embodiment, the processing steps are identical to those of the second embodiment up to the deposition of the base contacts 80 or 81. In this embodiment, separate base contacts 122 for each collector mesa 70 are formed exposing portions of the base layer 123, as shown in FIG. 12B. The processing of the third embodiment continues by etching through base layer 12 in portions 123 to form apertures 120 and to expose second base contacts 100 on the lower side of base layer 12 using first base contacts 122 as a mask. These steps are illustrated in FIG. 12A. A base interconnection 130 is then deposited in the apertures using a pattern as shown in FIG. 8E. The processing continues as in the first embodiment, where the thickness of the collector contact is increased to provide thick collector contact 90. Each of collector contacts 90 are interconnected using collector interconnect 91. The resulting device structure is shown in FIG. 13. The third embodiment further reduces the base contact resistance from that in the second embodiment by contacting the base layer on three sides. The third embodiment also provides a base interconnection to both first and second base contacts thereby shorting out these contacts independent of base width, sheet resistance and contact resistivity.

Figure 14:
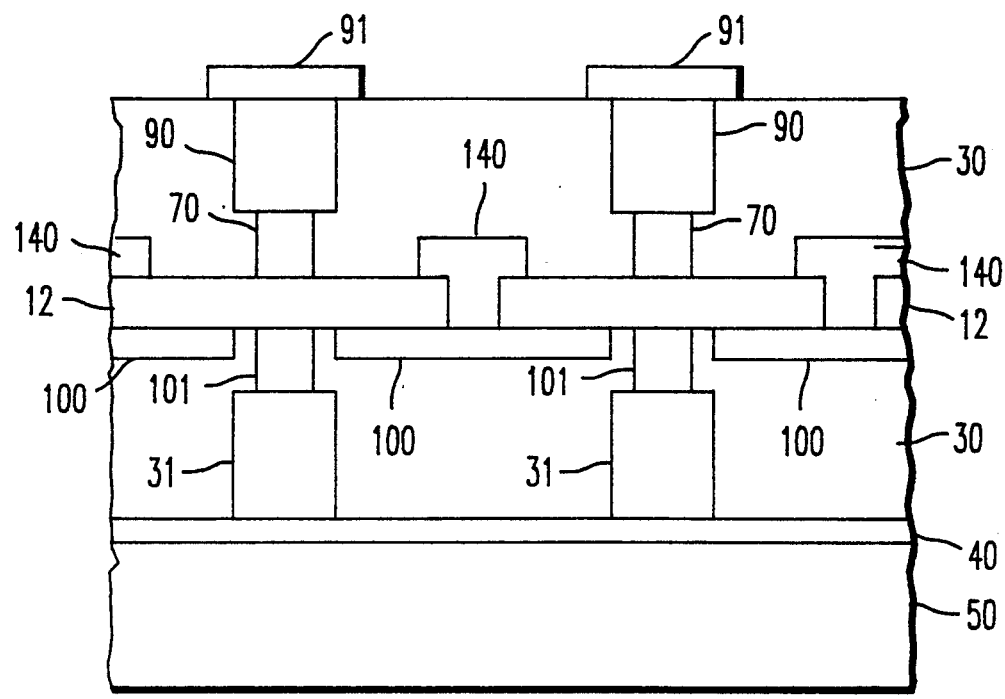
FIG. 14 is a sectional view of an HBT illustrating the device obtained using a fourth embodiment of the method according to the invention.

A fourth embodiment of the method according to the invention is shown in FIG. 14. In this embodiment, the same method steps as those of the second embodiment are carried out up to the deposition of base contacts 80 or 81. Here, forming base contacts 80 or 81 is omitted and an aperture is etched in base layer 12 using standard photolithographic and etching techniques to expose base contact 100. Subsequently, base interconnection electrode 140 is formed in the apertures making an electrical connection to base contacts 100. The resulting structure is shown in FIG. 14.

Figure 15:
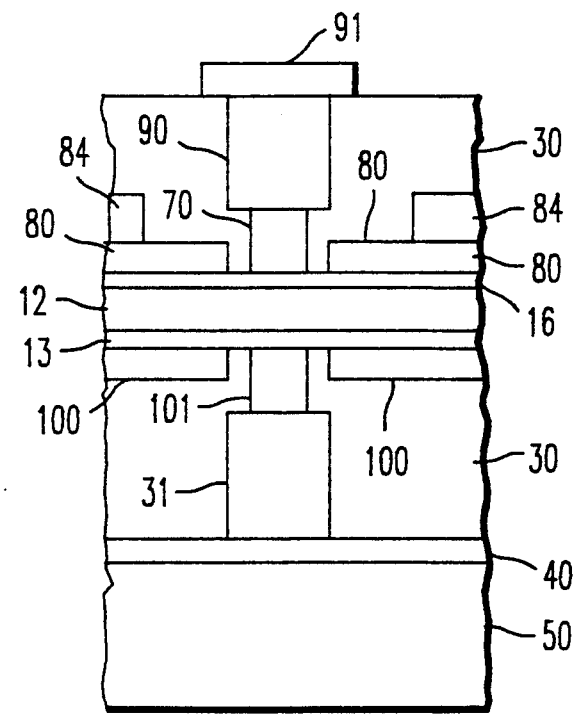
FIG. 15 is a sectional view of an HBT illustrating the device obtained using a fifth embodiment of the method according to the invention.

A fifth embodiment of the method according to the invention is shown in FIG. 15. In this embodiment, the same method steps as those in the other embodiments are performed except the etch stop layer 16 is not completely removed prior to the base contact 80 or 81 deposition and/or the emitter layer is not completely removed from the base layer prior to the base contact 100 deposition. This modification provides for passivation of the base layer by providing for complete coverage of the base layer by a suitable passivating (i.e., wider band-gap) layer. The third contacts may be alloyed to penetrate the thin layer of material to allow for good contact with little concern for compromising junctions or material on either side of the second layer. The upper and/or lower third contacts and interconnection to third contacts in the fifth embodiment may be made as described in the earlier embodiments.

As the etch stop layer 16 is typically very thin, it can be left on layer 12 to passivate layer 12. Alternatively, etch stop layer 16 can be etched to leave a desired thickness on layer 12. As mentioned above, the emitter is a typically a composite structure containing GaAs and AlGaAs, with the AlGaAs layer being in contact with base layer 12. Thus, as it is possible to etch emitter layer 13 with a known etch process having selectivity between GaAs and AlGaAs and leave the AlGaAs portion of emitter layer 13 on base layer 12 to passivate base layer 12.

It is to be noted that FIG. 15 shows a modification of the first embodiment where the base layer is passivated on both sides. It is to be understood that the base layer can be passivated on either or both sides, and passivation according to the fifth embodiment is also applicable to the second, third and fourth embodiments and modifications thereof. Also, the thicknesses of the portions of the emitter layer 13 and etch stop layer 16 are shown schematically, and are not intended to show exact or relative dimensions.

The method according to the present invention provides a very efficient and inexpensive method of forming a three terminal vertical device. The number of masks required to produce the device is minimized and self-aligned processing is exploited in many steps. Further, the self-alignment nature of the method reduces complexity as only one critical alignment is necessary, the alignment of the collector to emitter.

The present invention also virtually eliminates all crossover and extrinsic capacitances because all collector material under the extrinsic base is removed and connection to the device is made from the top, bottom and side. This provides not only a significant improvement in performance compared to a conventional device, but in addition, is capable of extracting the maximum intrinsic performance from the device. The device according to the invention also has the advantage of excellent heat sinking since the process attaches a heat sink which has better thermal conductive properties than a GaAs substrate. The heat sink also provides excellent structural rigidity and may also possess additional superior material properties such as electromagnetic radiation absorption compared to the native substrate.

While the present invention is illustrated using a three-terminal AlGaAs-GaAs heterojunction bipolar transistor, the present invention is no way limited to heterojunction bipolar transistors but is applicable to any three-terminal vertical device. For example, the present invention can be used to form a hot electron transistor (HET). Collector, base and emitter layers are first deposited, including etch stop layers if desired. The emitter and base layers are etched using the top side of the wafer to from an emitter/base mesa, and the collector layer is etched using the back side of the wafer.

Also, the present invention is not limited to an AlGaAs/GaAs device, but other III-V materials may be used. For example, a GaInAs/InP device consists of a InP substrate, 3,000 Å, a InP etch stop 100 Å thick located between the collector and a GaInAs base layer approximately 800 Å thick. The device further includes InP emitter approximately 500 Å thick and a 1,000 Å thick GaInAs emitter cap. An advantage of the GaInAs/InP material system with regard to the symmetric process is that a collector etch stop is not required. This is because selective etches exist which will etch the InP substrate without etching the GaInAs collector. For example, a HCl acid-base wet etch will etch InP without etching GaInAs while a phosphoric acid-base wet etch will etch GaInAs without etching InP.

It is also to be noted that an InP base etch stop is undesirable in the GaInAs/InP processing. However, since the etch stop is very thin, approximately 100 Å, it is not expected to produce a significant barrier to minority carrier transport from the base into the collector. Also, note that the thickness of the etch stop disclosed is for explaining the invention only and thinner etch stops are possible which will improve the device performance by eliminating any potential barriers to carrier transport.

It is also to be noted that alternate methods for achieving self-aligned base contacts from the top and- /or bottom compared to the method described above can be used.

Obviously, numerous other modifications to the disclosed method exist. It is to be understood that the present invention may be carried out differently than specifically disclosed in this application and is only limited by the appended claims.

What is claimed as new and desired to be secured by Letters Patent of the United States is:

1. A method of manufacturing a semiconductor device, comprising:
    successively forming first and second layers on a substrate;
    forming a third layer portion on said second layer;
    forming a first contact to said third layer portion;
    removing said substrate to expose said first layer;
    etching said first layer to form a first layer portion symmetric to said third layer portion;
    forming second and third contacts to said first layer portion and said second layer, respectively.

2. A method as recited in claim 1, further comprising:
    attaching a surrogate substrate to said first contact prior to removing said substrate.

3. A method as recited in claim 1, further comprising:
    forming first and second etch stop layers between said first layer and said substrate and between said first and second layers, respectively;
    removing said substrate using a first selective etching process;
    removing said first etch stop layer to expose said first layer;
    etching said first layer using a second selective etching process; and
    removing said second etch stop layer to expose said second layer.

4. A method as recited in claim 3, further comprising:
    forming said second etch stop layer to have a thickness which allows charge carriers to tunnel between said first and second layers.

5. A method as recited in claim 3, comprising:
    forming a GaAs collector layer as said first layer on a GaAs substrate;
    forming a GaAs base layer as said second layer;
    forming an AlGaAs/GaAs emitter layer as said third layer; and
    forming one of a (Ga)AlAs layer and an AlAs layer as said first etch stop layer and an InGaAs layer as said second etch stop layer.

6. A method as recited in claim 1, further comprising:
    forming an etch stop layer between said first and second layers;
    removing said substrate using a first selective etching process;
    etching said first layer using a second selective etching process; and
    removing said etch stop layer to expose said second layer.

7. A method as recited in claim 1, wherein forming said third layer portion comprises:
    forming a third layer on said second layer;
    forming a first contact portion on said third layer; and
    etching said third layer using said first contact portion as a mask.

8. A method as recited in claim 7, further comprising:
    etching said first layer to expose said second layer; and
    depositing a layer of contact material over said second layer and over only a peripheral portion of said second contact, leaving a portion of said second contact exposed.

9. A method as recited in claim 1, wherein forming said third layer portion comprises:
    forming a masking material on said second layer having a aperture therein; and
    epitaxially growing said third layer portion in said aperture;
    removing said masking material.

10. A method as recited in claim 1, wherein forming said first contact comprises:
    forming a first contact portion;
    depositing a planarizing film over said first contact portion;
    etching an aperture in said planarizing film to expose said first contact portion;
    depositing a first layer of contact material in said aperture and on said first contact portion; and
    forming an interconnection member connected to said first layer of contact material.

11. A method as recited in claim 10, further comprising:
    depositing a second planarizing film on said planarizing film and said first layer of contact material deposited in said aperture;
    forming a second aperture in said second planarizing film to expose said first layer of contact material;
    depositing a second layer of contact material in said second aperture and on said first layer of contact material;
    repeating said depositing said second planarizing film, forming said second aperture and depositing said second layer of contact material steps until a first thickness of said second layer of contact material is deposited; and
    forming said interconnection member connected to said second contact material.

12. A method as recited in claim 1, further comprising:
    forming a second contact portion on said first layer;
    etching said first layer using said second contact portion as a mask to form said first layer portion, undercutting said second contact portion and exposing said second layer;
    depositing a first layer of contact material over said second contact portion and said second layer to form said third contact self-aligned to said first layer portion;
    depositing a planarizing film covering said second contact portion;
    etching an aperture in said planarizing film to expose said first layer of contact material;
    depositing a second layer of contact material in said aperture and on said first layer of contact material; and
    forming an interconnection member connected to said second layer of contact material.

13. A method as recited in claim 12, further comprising:
    depositing a second planarizing film on said planarizing film and said second layer of contact material deposited in said aperture;
    forming a second aperture in said second planarizing film to expose said second layer of contact material;
    depositing a third layer of said contact material in said second aperture and on said second layer of contact material;

repeating said depositing said second planarizing film, forming said second aperture and depositing said third layer of contact material steps until a desired thickness of said third layer of contact material is deposited; and forming said interconnection member connected to said third layer of contact material.

14. A method as recited in claim 12, wherein depositing said first layer of contact material comprises:

depositing a layer of contact material over said second layer and over only a peripheral portion of said second contact portion, leaving a portion of said second contact portion exposed.

15. A method as recited in claim 1, further comprising:

said second layer having upper and lower sides;

forming a lower third contact self-aligned with said first contact on said lower side of said second layer;

forming an upper third contact self-aligned with said second contact on said upper side of said second layer; and forming an interconnection member connected to at least one of said upper and lower third contacts.

16. A method as recited in claim 1, further comprising:

forming a third layer on said second layer;

forming a first contact portion on said third layer;

etching said third layer using said first contact portion as a mask, undercutting said first contact portion and exposing said second layer, to form said third layer portion;

depositing a first contact material over said first contact portion and said second layer to form a lower third contact self-aligned to said third layer portion;

forming a second contact portion on said first layer;

etching said first layer using said second contact portion as a mask and exposing said second layer, to form said first layer portion;

depositing a second contact material over said second contact portion and said second layer to form an upper third contact self-aligned to said first layer portion and aligned with said lower third contact; and forming an interconnection member contacting said upper third contact.

17. A method as recited in claim 1, further comprising:

forming a third layer on said second layer;

forming a first contact portion on said third layer;

etching said third layer using said first contact portion as a mask and exposing said second layer, to form said third layer portion;

depositing a first contact material over said first contact portion and said second layer to form a lower third contact self-aligned to said third layer portion;

forming a second contact portion on said first layer;

etching said first layer using said second contact portion as a mask and exposing said second layer, to form said first layer portion;

depositing a second contact material over said second contact portion and said second layer to form an upper third contact self-aligned to said first layer portion;

etching said second layer adjacent to said upper third contact to expose said lower third contact; and forming an interconnection member contacting said upper and lower third contacts.

18. A method as recited in claim 1, comprising:

forming a GaAs collector layer as said first layer on a GaAs substrate;

forming a GaAs base layer as said second layer; and forming an AlGaAs/GaAs emitter layer as said third layer.

19. A method as recited in claim 1, further comprising:

forming an etch stop layer between said first and second layers; and performing at least one of:

etching said first layer using a first selective etching process to form said first layer portion while leaving a first thickness of said etch stop layer on said second layer; and forming a third layer on said second layer, forming a first contact portion on said third layer, and etching said third layer using said first contact portion as mask to form said third layer portion while leaving a second thickness of said third layer on said second layer.

20. A method as recited in claim 1, wherein etching said first layer to form a first layer portion symmetric to said third layer portion comprises forming said first and third layer portions to be substantially the same size and vertically aligned.

21. A method as recited in claim 1, comprising:

successively forming a plurality of semiconductor layers on a substrate including said first, second and third layers;

processing said third layer to form a first device element configuration thereof including said third layer portion, and said first contact using a top side of said substrate; and processing a layer other than said third layer to form a second device element configuration thereof symmetric to said first device element configuration and said second contact using a back side of said substrate.

22. A method as recited in claim 21, further comprising:

removing said substrate to expose said layer other than said uppermost layer; and attaching a surrogate substrate to said first contact.

23. A method as recited in claim 21, further comprising:

forming first and second etch stop layers between said third layer and said second layer and between said substrate and said first layer, respectively.

24. A method as recited in claim 21, wherein processing said layer other than said third layer comprises forming said respective first and second device element configurations of said third layer and said layer other than uppermost layer to be substantially the same size and vertically aligned.

25. A method of manufacturing a heterojunction bipolar transistor, comprising:

forming a first etch stop layer on a substrate;

forming a collector layer on said first etch stop layer;

forming a second etch stop layer on said collector layer;

forming a base layer on said second etch stop layer;

forming an emitter layer on said base layer;

forming a first contact portion on said emitter layer;

etching said emitter layer using said first contact portion as mask and exposing said base layer, to form an emitter;

forming an emitter contact connected to said first contact portion;

attaching a surrogate substrate to said emitter contact;

removing said substrate and exposing said first etch stop layer;

etching said first etch stop layer to expose said collector layer;

forming a second contact portion on said collector layer aligned with said first contact portion;

etching said collector layer using said second contact portion as mask and exposing said second etch stop layer, to form a collector;

etching said second etch stop layer to expose said base layer;

depositing a contact material over said second contact portion and said base layer using said second contact portion as a mask to form a base contact self-aligned to said collector; and forming a collector contact connected to said second contact portion.

26. A method as recited in claim 25, comprising:

forming a GaAs layer as said collector layer on a GaAs substrate;

forming a GaAs layer as said base layer; and forming an AlGaAs/GaAs layer as said emitter layer.

27. A method as recited in claim 25, comprising:

forming a GaAs layer as said collector layer on a GaAs substrate;

forming a GaAs layer as said base layer;

forming an AlGaAs/GaAs layer as said emitter layer; and forming one of a (Ga)AlAs layer and an InGaAs layer as each of said first and second etch stop layers.

28. A method as recited in claim 25, further comprising:

depositing a first layer of contact material over said first contact portion and said base layer to form a lower base contact self-aligned to said emitter;

depositing a second layer of said contact material over said second contact portion and said base layer to form an upper base contact self-aligned to said collector; and forming an base interconnection member contacting at least one of said upper and lower base contacts.

29. A method as recited in claim 25, further comprising: etching said base layer adjacent to said upper base contact to expose said lower base contact; and forming said interconnection member to contact said upper and lower base contacts.

* * * * *